(12) United States Patent
Hara et al.

(10) Patent No.: US 6,451,112 B1
(45) Date of Patent: Sep. 17, 2002

(54) METHOD AND APPARATUS FOR FABRICATING HIGH QUALITY SINGLE CRYSTAL

(75) Inventors: Kazukuni Hara, Kasugai; Kouki Futatsuyama, Kariya; Shoichi Onda, Toyokawa; Fusao Hirose, Obu; Emi Oguri, Nishikamo-gun; Naohiro Sugiyama; Atsuto Okamoto, both of Aichi-gun, all of (JP)

(73) Assignee: Denso Corporation, Kariya (JP)

( * ) Notice: Subject to any disclaimer, the term of this patent is extended or adjusted under 35 U.S.C. 154(b) by 7 days.

(21) Appl. No.: 09/686,232

(22) Filed: Oct. 12, 2000

(30) Foreign Application Priority Data

Oct. 15, 1999 (JP) ............................. 11-294468
Oct. 15, 1999 (JP) ............................. 11-294471

(51) Int. Cl.[7] .............................. C30B 29/36
(52) U.S. Cl. .................. 117/101; 117/105; 117/109; 117/200; 117/951; 118/715
(58) Field of Search ................ 117/200, 101, 117/105, 109, 951; 118/715

(56) References Cited

U.S. PATENT DOCUMENTS

| RE34,861 E | 2/1995 | Davis et al. | |
| 5,433,167 A | 7/1995 | Furukawa et al. | |
| 5,441,011 A | 8/1995 | Takahaski et al. | |
| 5,704,985 A | 1/1998 | Kordina et al. | |
| 5,863,325 A | * 1/1999 | Kanemoto et al. | 117/105 |
| 5,879,462 A | * 3/1999 | Kordina et al. | 118/725 |
| 5,895,526 A | * 4/1999 | Kitoh et al. | 117/84 |
| 5,985,024 A | * 11/1999 | Balakrishna et al. | 117/99 |
| 6,056,820 A | * 5/2000 | Balakrishna et al. | 117/951 |
| 6,110,279 A | 8/2000 | Kito et al. | |
| 6,193,797 B1 | * 2/2001 | Shiomi et al. | 117/951 |

FOREIGN PATENT DOCUMENTS

| JP | 5-32496 | | 2/1993 | |
| JP | 6-128094 | * | 5/1994 | 117/951 |
| JP | 10-139589 | | 5/1998 | |
| JP | 2001-72490 | * | 3/2001 | |

* cited by examiner

Primary Examiner—Robert Kunemund
(74) Attorney, Agent, or Firm—Law Offices of David G. Posz

(57) ABSTRACT

A crucible for growing a single crystal therein has a seed crystal attachment portion and a peripheral portion surrounding the seed crystal attachment portion through a gap provided therebetween. The seed crystal attachment portion has a support surface for holding a seed crystal on which the single crystal is to be grown, and the support surface is recessed from a surface of the peripheral portion. The seed crystal is attached to the support surface to cover an entire area of the support surface. Accordingly, no poly crystal is formed on the seed crystal attachment portion, and the single crystal can be grown on the seed crystal with high quality.

27 Claims, 10 Drawing Sheets

METHOD AND APPARATUS FOR FABRICATING HIGH QUALITY SINGLE CRYSTAL

CROSS REFERENCE TO RELATED APPLICATIONS

This application is based upon and claims the benefit of Japanese Patent Applications No. 11-294471 filed on Oct. 15, 1999, and No. 11-294468 filed on Oct. 15, 1999, the contents of which are incorporated herein by reference.

BACKGROUND OF THE INVENTION

1. Field of the Invention

This invention relates to a method and an apparatus for fabricating a high quality single crystal, which are especially suitable to be used for fabricating a high quality silicon carbide single crystal on a seed crystal attached to a seed crystal attachment member.

2. Description of the Related Art

A silicon carbide single crystal is expected as a semiconductor substrate for a power device, due to its high withstand voltage and high electron mobility. Generally, a single crystal growth method, so called a sublimation method (modified Lely method), is used for growth of a silicon carbide single crystal.

In the modified Lely method, a silicon carbide material is introduced into a graphite crucible, and a seed crystal is attached to an inner wall of the graphite crucible to face the material part. The material part is then heated up to a temperature of 2200° C. to 2400° C. to generate sublimation gas. Accordingly, a silicon carbide single crystal is grown, by recrystallization of the material, on the seed crystal having a temperature that is set to be lower than that of the material part by several dozens to several hundreds degrees.

In this conventional method, however, it is required to further improve crystallinity of the silicon carbide single crystal. For example as shown in FIG. 5A, the seed crystal 5 is attached to the inner wall of the graphite crucible 101 directly or through a protruding portion provided on a lid member 112 of the graphite crucible 101. Because of this, as shown in FIG. 5B, a poly crystal 8 is grown on the inner wall of the graphite crucible 101 exposed to the crystal growth ambient as the silicon carbide single crystal 107 is grown, and the poly crystal 8 is attached and fused to a peripheral portion 107a of the silicon carbide single crystal 107. Consequently, the peripheral portion 107a is polycrystallized, and defects are produced in the silicon carbide single crystal 107.

To solve this problem, JP-A-6-48898 proposes to perform a step for stopping single crystal growth before the peripheral poly crystal becomes larger than the single crystal and restarting the single crystal growth after the peripheral poly crystal is removed from the graphite crucible, and repeat the step several times. However, because this step must be repeated several times for forming one single crystal ingot, the process is complicated. Further, when the silicon carbide single crystal should be grown at a high temperature of 2000° C. or more, raising and lowering the temperature requires long time, and the process time for fabricating single crystal is significantly increased. Furthermore, it is very difficult to find out the timing of the peripheral poly crystal not exceeding the single crystal in size, i.e., the timing immediately before the poly crystal is fused to the single crystal, and to repeat it stably.

SUMMARY OF THE INVENTION

The present invention has been made in view of the above problems. An object of the present invention is to provide a method and an apparatus for fabricating a single crystal with high quality.

According to one aspect of the present invention, a single crystal is grown on a seed crystal disposed in a vessel. The vessel defines therein a growth space, and has a seed crystal attachment portion and a peripheral portion surrounding the seed crystal attachment portion. The seed crystal attachment portion has a support surface that is exposed to the growth space, and recessed from a peripheral surface of the peripheral portion. The seed crystal is attached to the support surface to cover an entire area of the support surface. In this method and apparatus, since the seed crystal attachment portion is not exposed to the growth surface when the single crystal is grown on the seed crystal, no poly crystal is grown on the surface of the seed crystal attachment member, and fusing of poly crystal to the single crystal can be prevented. As a result, the single crystal can be fabricated with high quality.

According to another aspect of the present invention, within a vessel such as a crucible, a single crystal is grown on a growth surface of the seed crystal, and a poly crystal is grown on a peripheral surface surrounding the growth surface to have a height approximately equal to a height of the single crystal. That is, the single crystal is grown to be embedded in the poly crystal. Accordingly, temperature distribution on the growth surface of the single crystal becomes uniform. In consequence, the growth surface of the single crystal can be kept flat even when the length (height) dimension of the single crystal is increased and no crack is generated in the single crystal.

BRIEF DESCRIPTION OF THE DRAWINGS

Other objects and features of the present invention will become more readily apparent from a better understanding of the preferred embodiments mentioned below with reference to the following drawings, in which.

DETAILED DESCRIPTION OF THE PREFERRED EMBODIMENTS (First Embodiment)

Figure 1:
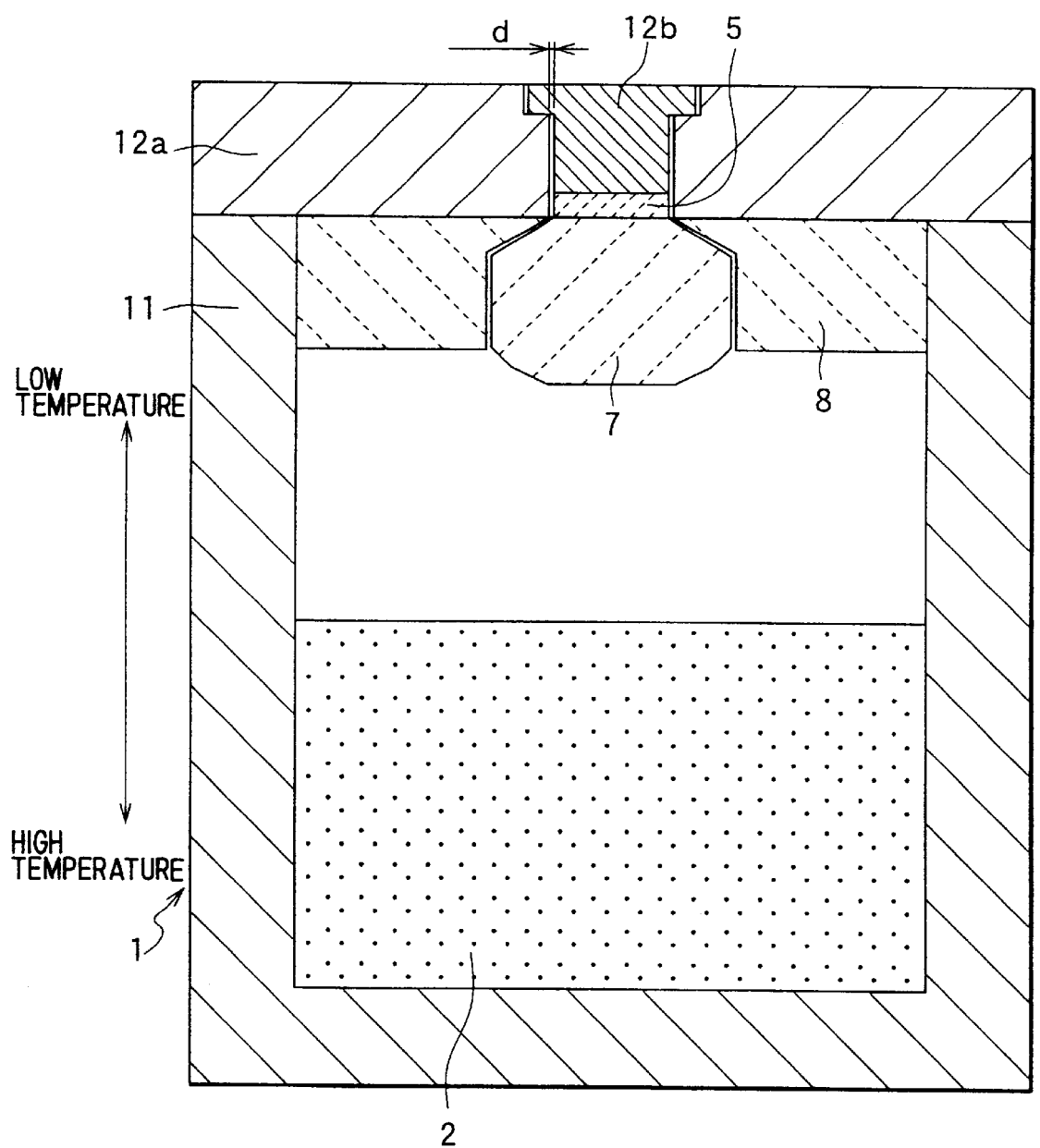
FIG. 1 is a cross-sectional view showing a graphite crucible according to a first preferred embodiment.

FIG. 1 shows a graphite crucible 1 as a crystal growth apparatus used in a first preferred embodiment of the present invention, and is specifically a cross-sectional view showing a state where a silicon carbide single crystal 7 is grown on a seed crystal 5, which is composed of a silicon carbide single crystal layer, by heating and sublimating silicon carbide material 2 disposed in the graphite crucible 1.

The graphite crucible 1 is composed of a crucible body 11 with an upper face opened, and a lid member 12 for closing the opening portion of the crucible body 11. The lid member 12 serves as a base for supporting the seed crystal 5. The lid member 12 is composed of a lid portion 12a and a seed crystal attachment member 12b. The lid portion 12a has a circular opening portion at a center thereof, and forms a contour of the lid member 12. The seed crystal attachment member 12b can be detachably attached to the opening portion of the lid portion 12a, and has a surface (support surface) for supporting the seed crystal 5. The seed crystal attachment member 12b has generally a cylindrical shape, and a flange portion is provided at an end of the seed crystal attachment member 12b opposite to a side where the seed crystal 5 is to be attached. When the seed crystal attachment member 12b is disposed in the opening portion provided at the center of the lid portion 12a, the seed crystal attachment member 12b is fixed at a specific position in the lid portion 12a with the flange portion fixedly caught by the lid portion 12a.

The inner diameter of the opening portion of the lid portion 12a is approximately equal to the outer diameter of the seed crystal attachment member 12b such that a gap (groove) d is provided between the inner circumference wall (edge face) of the opening portion of the lid portion 12a and the outer circumference wall of the seed crystal attachment member 12b when the seed crystal attachment member 12b is attached to the lid portion 12a. The gap d is controlled to be in a range of 0.1 mm to 1 mm. If the gap d is excessively decreased, the gap d works as if it is substantially zero, and if the gap d is excessively increased, the gap d works similarly to a growth space.

The thickness (length in an axial direction) of the seed crystal attachment member 12b is smaller than that of the lid portion 12a by a thickness corresponding to or slightly smaller than that of the seed crystal 5. That is, the lid member 12 is constructed to have a recess portion where the seed crystal is to be attached when the seed crystal 5 is not attached, and to have a growth surface of the seed crystal 5, which is coplanar with or slightly protruding from the surface of the lid portion 12b, when the seed crystal 5 is attached.

Thus, because the inner diameter of the opening portion of the lid portion 12a is set to be approximately equal to the outer diameter of the seed crystal attachment member 12b, the surface of the seed crystal attachment member 12b (bottom surface of the recess portion of the lid member 12) is completely covered with the seed crystal 5 not to be externally exposed when the seed crystal 5 is attached. Further, because the growth surface of the seed crystal 5 is positioned not to cave in as compared to the adjacent lid portion 12, carbon gas sublimated from an edge portion of the lid portion 12a provided adjacently to the seed crystal 5 do not affect the growth surface of the seed crystal 5.

Further, because the seed crystal attachment member 12b is formed separately form the lid portion 12a, and thinned as compared to the lid portion 12a, the growth surface temperature of the seed crystal 5 can be controlled to be slightly lower than the surface temperature of the lid portion 12a as a result of heat transfer. Because of this, crystal growth occurs on the growth surface of the seed crystal 5 in preference to the lid portion 12a. Incidentally, the graphite crucible 1 can be heated by a heater within a vacuum vessel (heating furnace) into which argon gas is introduced. The temperature of the seed crystal 5 can be kept to be lower than that of the silicon carbide material powder 2 by about 10° C. to 100° C.

The silicon carbide single crystal 7 is grown on the growth surface of the seed crystal 5 in the graphite crucible constructed as mentioned above. As shown in FIG. 1, the silicon carbide single crystal 7 grows while being expanded in its radial direction involving its crystal growth, and continues to grow with an approximately given diameter after the diameter is increased to some extent. At that time, the poly crystal 8 also grows from the surface of the lid portion 12a together with the growth of the silicon carbide single crystal 7; however, it is revealed that the poly crystal 8 grows to surround the silicon carbide single crystal 7 with a specific interval from the single crystal 7. That is, the silicon carbide single crystal 7 grows as if it is embedded in the polycrystal 8, i.e. undergoes embedding growth.

Thus, when the single crystal and the poly crystal respectively grow on the adjacent but different growth surfaces having an approximately identical level (the surface of the seed crystal 5 and the surface of the lid portion 12a in this embodiment), the single crystal and poly crystal can grow separately from each other due to the specific gap not to fuse together. In consequence, occurrence of crystal defects caused by the poly crystal attached to the single crystal can be prevented, and the silicon carbide silicon carbide 7 can be manufactured in a large diameter and high quality.

Next, a result of an experiment in which the silicon carbide single crystal 7 was grown on the surface of the seed crystal will be explained. The growth of the silicon carbide single crystal 7 was carried out as follows.

First, the seed crystal 5 was cut out of a silicon carbide single crystal, which was formed by an Acheson method, to have a diameter of 10 mm and a thickness of 1 mm, and the surface was mirror-finished. At that time, the crystal direction of the seed crystal 5 was fixed with the growth surface corresponding to a $(000\bar{1})$ plane precisely. This seed crystal 5 was bonded to the seed crystal attachment member 12b, and then the seed crystal attachment member 12b was assembled with the lid portion 12a such that the gap d between the seed crystal attachment member 12b and the lid portion 12a was set at 0.5 mm.

The assembled lid portion 12a and the seed crystal attachment member 12b were attached to the crucible body 11 in which silicon carbide material powder 2 was put in advance. Then, the graphite crucible 1 was disposed in the heating furnace, and the silicon carbide single crystal 7 was grown by a sublimation method for 24 hours under conditions that the temperature of the silicon carbide material powder 2 was 2290° C., the growth surface temperature of the seed crystal 5 was 2230° C., and ambient pressure was 1 Torr.

The finally obtained silicon carbide single crystal 7 was about 12 mm in growth height and about 15 mm in maximum diameter. Poly crystal was hardly produced on the seed crystal attachment member 12b. The poly crystal 8 produced from the surface of the single crystal growth apparatus at a peripheral portion of the seed crystal 5 was completely isolated from the silicon carbide single crystal 7. A silicon carbide single crystal substrate cut out of the silicon carbide single crystal 7 hardly had, at a peripheral edge portion thereof, poly crystalline regions, cracks, and sub-grain defects that can be produced by fusing with poly crystals.

(Second Embodiment)

The graphite crucible 1 in a second preferred embodiment is different from that in the first embodiment only in construction of the lid member 12, and only points different from the first embodiment will be explained in this embodiment. The same parts as those in the first embodiment are designated by the same reference numerals as in the first embodiment.

Figure 2:
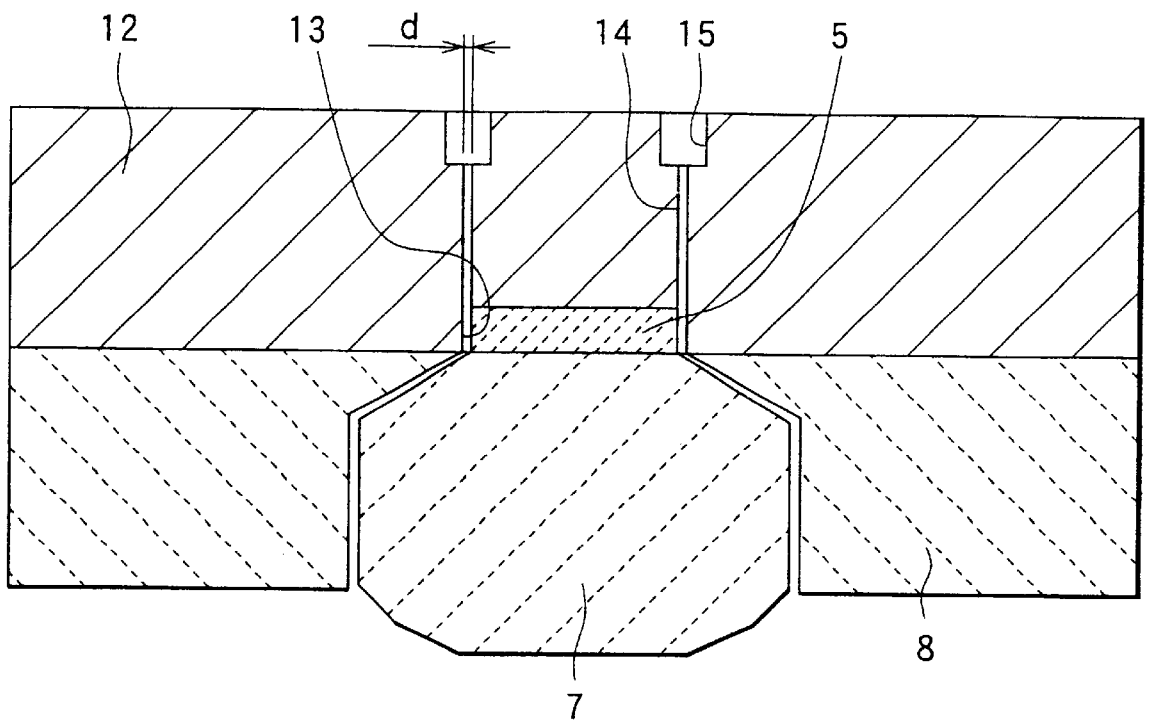
FIG. 2 is a cross-sectional view showing a lid member of a graphite crucible according to a second preferred embodiment.
Figure 3A:
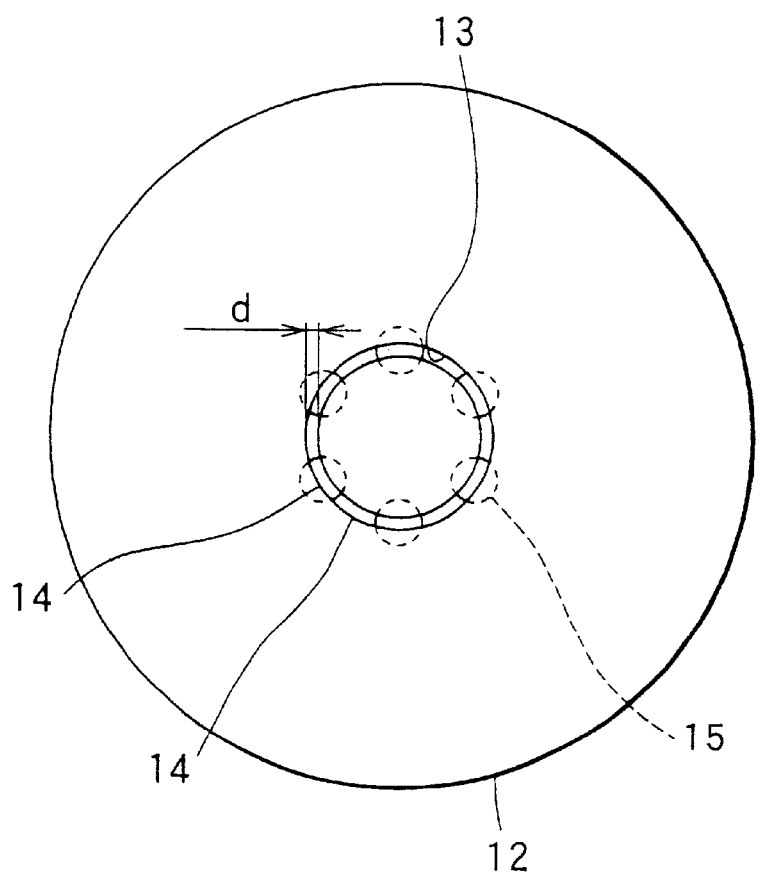
FIGS. 3A and 3B are front view and back view showing the lid member shown in FIG. 2.
Figure 3B:
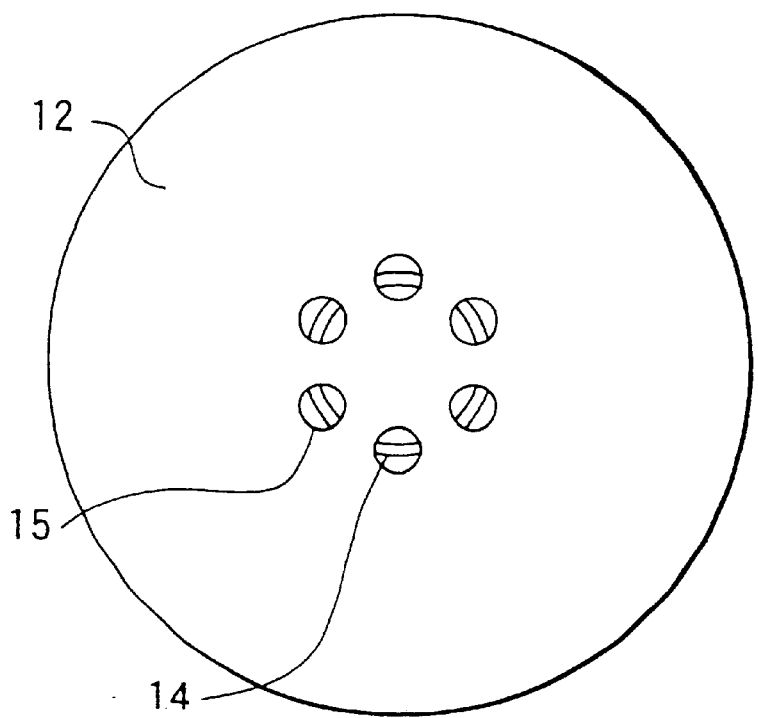

FIG. 2 shows a cross-section of the lid member 12 of the graphite crucible 1 as a crystal growth apparatus in this embodiment, and FIGS. 3A and 3B respectively show a front view and a back view of the lid member 12 shown in FIG. 2. In this embodiment, the lid member 12 is composed of a single member, and has a generally circular recess 13 at the central portion thereof. The recess 13 works similarly to the seed crystal attachment member 12b in the first embodiment, and the seed crystal 5 is disposed in the recess 13.

A notch 14 is formed at an outer circumference of the recess 13 in the lid member 12 with a specific depth, and gas vents 15 are formed at several (six in FIGS. 3A and 3B) locations at the back side of the lid member 12 (the side opposite to the face on which the seed crystal 5 is to be disposed) to communicate with the notch 14. Gas is released from the graphite crucible 1 through the notch 14 and the gas vents 15. Incidentally, the depth of the recess 13 is approximately equal to or slightly smaller than the thickness of the seed crystal 5, and the width of the notch 14 is set to be equal to that of the gap d that is defined between the lid portion 12a and the seed crystal attachment member 12b in the first embodiment.

Next, a result of an experiment in which the silicon carbide single crystal 7 was grown on the surface of the seed crystal in this embodiment will be explained.

First, the seed crystal 5 similar to that used in the experiment of the first embodiment was prepared, and the seed crystal 5 was bonded in the recess 13. Then, the lid member 12 was attached to the crucible body 11 holding the silicon carbide material powder 2 therein. Then, the graphite crucible 1 was disposed in the heating furnace, and the silicon carbide single crystal 7 was grown by the sublimation method for 24 hours under conditions that the temperature of the silicon carbide material powder 2 was 2300° C., the growth surface temperature of the seed crystal 5 was 2230° C., and the ambient pressure was 1 Torr.

The finally obtained silicon carbide single crystal 7 was about 15 mm in growth height and about 15 mm in maximum diameter. Part of sublimation gas passed through the gas vents 15 and was poly-crystallized on the outer part of the graphite crucible 1. No poly crystal was produced from the seed crystal attachment member. The poly crystal 8 grown on the surface of the lid member 12 at the periphery of the seed crystal 5 was completely isolated from the silicon carbide single crystal 7. A silicon carbide single crystal substrate formed by cutting the silicon carbide single crystal 7 hardly had poly crystalline regions, cracks, or sub-grain defects, which can be produced by fusing with poly crystal, at a peripheral edge portion thereof.

(Third Embodiment)

The graphite crucible 1 in a third preferred embodiment is different from that in the first embodiment only in construction of the lid member 12, and only points different from the first embodiment will be explained. The same parts as those in the first embodiment are designated by the same reference numerals as in the first embodiment.

Figure 4:
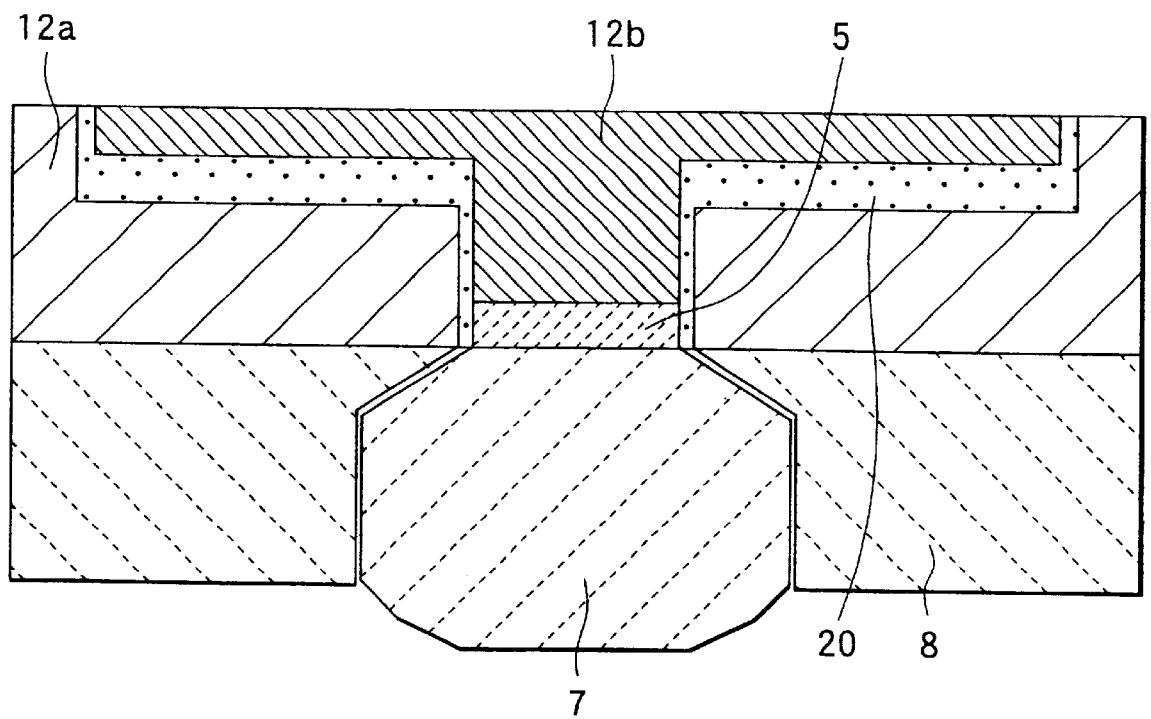
FIG. 4 is a cross-sectional view showing a lid member of a graphite crucible according to a third preferred embodiment.

FIG. 4 shows a cross-section of the lid member 12 of the graphite crucible 1 as a crystal growth apparatus in this embodiment. Like the first embodiment, the lid member 12 in this embodiment is composed of a lid portion 12a and a seed crystal attachment member 12b. However, as compared to the first embodiment, the projecting amount (size) of the flange portion of the seed crystal attachment member 12b is enlarged, and the gap between the lid portion 12a and the seed crystal attachment member 12b is widened, and is filled with porous graphite. The porous graphite has a heat insulation property and suppresses heat transfer from the lid portion 12a to the seed crystal attachment member 12b. The porous graphite further has fine holes which material gas in the graphite crucible 1 can pass through. The other features such as the thickness of the seed crystal attachment member 12b are substantially the same as those in the first embodiment.

Next, a result of an experiment in which the silicon carbide single crystal 7 was grown on the surface of the seed crystal 5 will be explained.

First, the seed crystal 5 similar to that used in the experiment of the first embodiment was prepared. Successively, the seed crystal attachment member 12b was fitted in the central opening portion of the lid portion 12a with the porous graphite sandwiched therebetween. After that, the seed crystal 5 was attached to the seed crystal attachment member 12b. Then, the lid member 12 was attached to the crucible body 11 in which the silicon carbide material powder 2 was put in advance.

Then, the graphite crucible 1 was disposed in the heating furnace, and the silicon carbide single crystal 7 was grown by the sublimation method for 24 hours under conditions that the temperature of the silicon carbide material powder 2 was 2290° C., the growth surface temperature of the seed crystal 5 was 2230° C., and the ambient pressure was 1 Torr.

The finally obtained silicon carbide single crystal 7 was about 13 mm in growth height and about 18 mm in maximum diameter. The diameter of the silicon carbide single crystal 7 was larger than that of the experimental result in the first embodiment. Further, as in the first embodiment, a silicon carbide single crystal substrate provided by cutting the silicon carbide single crystal 7 hardly had poly crystalline regions, cracks, or sub-grain defects, which can be produced by fusing with poly crystal, at a peripheral edge portion thereof.

Figure 5A:
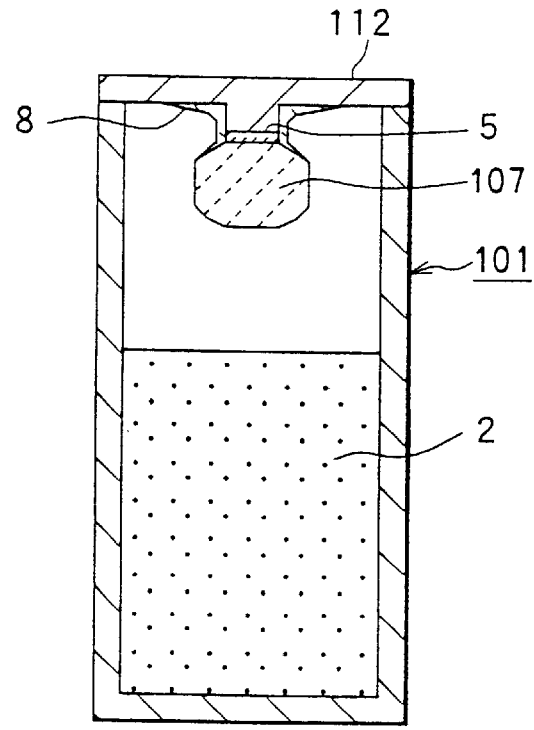
FIG. 5A is a cross-sectional view showing a conventional graphite crucible.
Figure 5B:
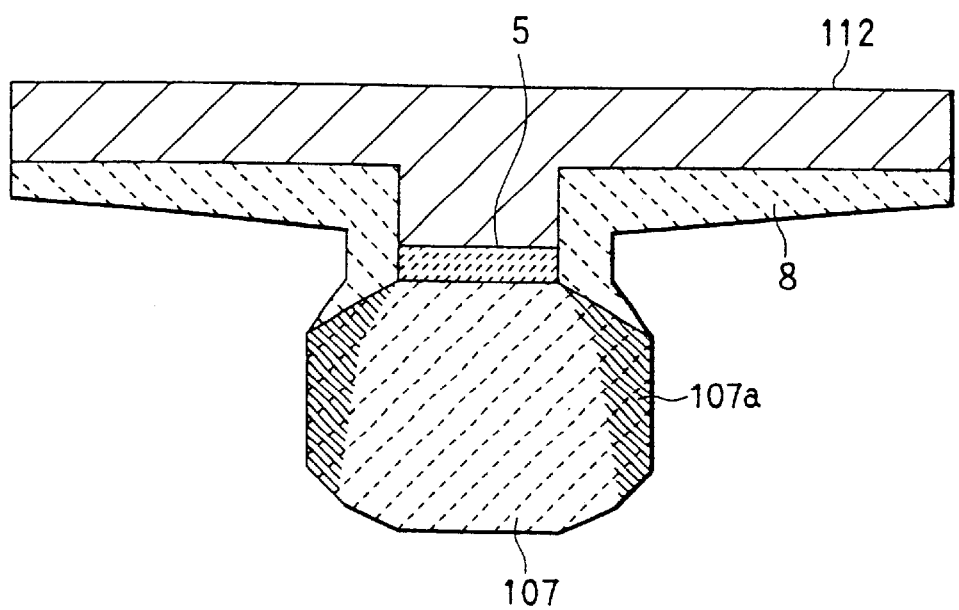
FIG. 5B is an enlarged cross-sectional view showing a lid member and its vicinity of the graphite crucible shown in FIG. 5A.

As a reference, a result of an experiment in which a silicon carbide single crystal was grown in the conventional graphite crucible 101 shown in FIGS. 5A and 5B will be explained.

First, the seed crystal 5 having a construction substantially the same as that of the first embodiment was prepared. Then, the seed crystal 5 was bonded to the protruding portion of the lid portion 112 of the graphite crucible 101, and attached to the graphite crucible body in which the silicon carbide material powder 2 was put in advance. Then, the graphite crucible 101 was disposed in the heating furnace, and the silicon carbide single crystal 107 was grown by the sublimation method for 24 hours, under conditions that the temperature of the silicon carbide material powder 2 was 2290° C., the growth surface temperature of the seed crystal 5 was 2230° C., and the ambient pressure was 1 Torr.

The finally obtained silicon carbide single crystal 107 was about 12 mm in growth height and about 15 mm in maximum diameter. The poly crystal 8 was, however, produced around the protruding portion, and from that portion, the poly crystal 8 was grown along the circumference of the silicon carbide single crystal 107. Poly crystalline regions, cracks, and sub-grain defects were observed at a peripheral edge portion 107a of a silicon carbide single crystal substrate formed by cutting the silicon carbide single crystal 107.

In the aforementioned embodiments, although the present invention is applied to crystal growth of silicon carbide single crystal, it may be applied to crystal growths of other materials. Further, although the graphite crucible 1 is used as a single crystal growth apparatus, the inner wall of the graphite crucible 1 may be covered with high melting point metal or its carbide. When the inner wall of the graphite crucible 1 is covered with high melting point metal, an Si/C ratio becomes uniform. This makes it possible to form the silicon carbide single crystal 7 with higher quality. For example one of hafnium carbide (HfC), tantalum carbide (TaC), zirconium carbide (ZrC), and titanium carbide (TiC) can be used as the high melting point metal.

In the third embodiment, instead of porous graphite, other materials can be used as long as gas can pass through them. Further, in the third embodiment the porous graphite is disposed in the gap between the lid portion 12a and the seed crystal attachment member 12b to suppress heat transfer to the seed crystal attachment member 12b. Otherwise, a counterbore may be provided on the seed crystal attachment member 12b at an opposite side of the seed crystal 5 (at the back surface). Also, low temperature gas may be sprayed to the back surface of the seed crystal attachment member 12b such that the growth surface of the seed crystal 5 can have a lower temperature than that of the front surface of the lid portion 12a. At that time, low temperature gas embraces inert gas the same as that introduced to the graphite crucible 1 during the crystal growth. When a doped single crystal is to be formed as the silicon carbide single crystal 7, inert gas for being sprayed to the seed crystal attachment member 12b can contain elements necessary for doping the single crystal. For example, nitrogen (N), boron (B), aluminum (Al), phosphorus (P), or arsenic (As) may be contained in the inert gas.

(Fourth Embodiment)

Figure 6:
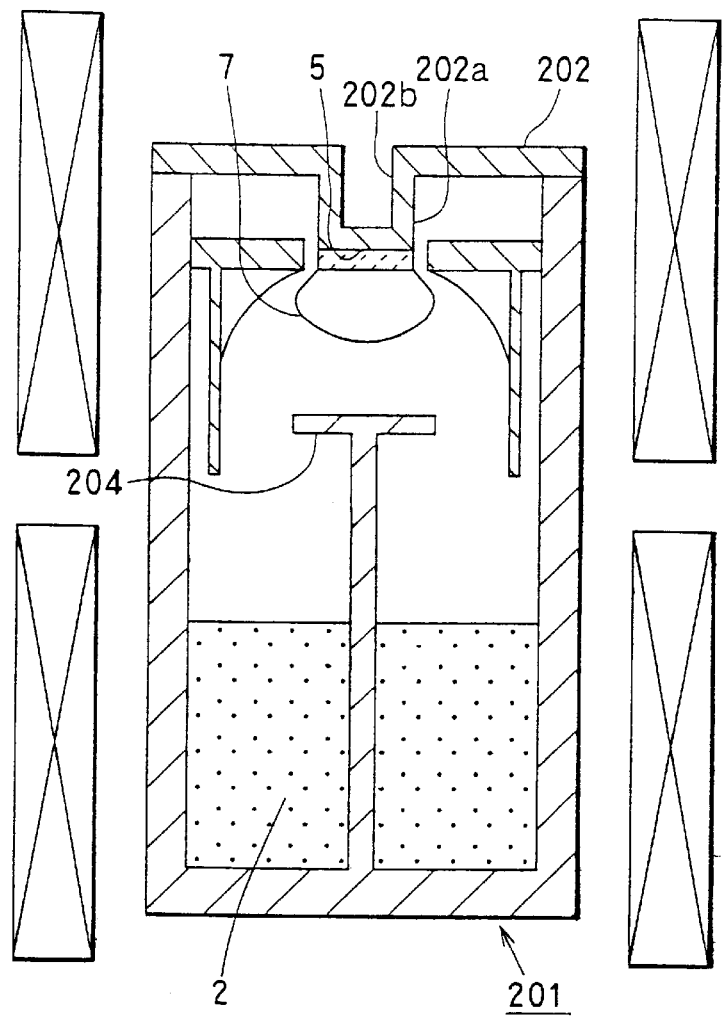
FIG. 6 is a cross-sectional view showing a graphite crucible that is manufactured as a prototype in a fourth preferred embodiment.

In a forth preferred embodiment, first, a graphite crucible 201 shown in FIG. 6 was manufactured as a prototype, and a silicon carbide single crystal was grown in the graphite crucible 201 by the sublimation method. Referring to FIG. 6, a lid member 202 of the graphite crucible 201 has a protruding portion 202a on an inner wall thereof, and a seed crystal 5 is attached to the protruding portion 202a. One side of the protruding portion 202a opposite to the surface to which the seed crystal 5 is to be bonded is caved to form a counterbore 202b. Further a shielding plate 204 is provided to face the growth surface of the seed crystal 5 so that the seed crystal 5 has a temperature lower than that of the other portions. A silicon carbide single crystal 7 was grown on the seed crystal 5 within the graphite crucible 201 constructed as mentioned above.

Then, it was revealed that the growth surface of the silicon carbide single crystal 7 was curved as its length was increased, and crack defects were liable to be produced on the curved growth surface. Therefore, the fourth embodiment was made to grow the silicon carbide single crystal with a large size while keeping its growth surface flat so as to prevent crack defects on the growth surface.

Figure 7:
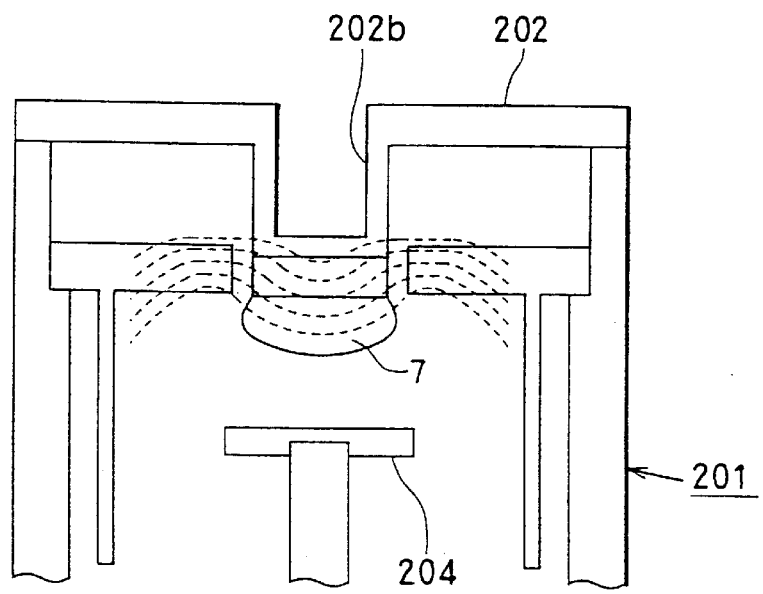
FIG. 7 is a schematic view showing temperature distribution on a growth surface of a seed crystal in the prototype graphite crucible shown in FIG. 6, which is obtained by a simulation.

To solve this problem, the cause for making the growth surface curved was studied by a heat simulation analysis using the graphite crucible 201 shown in FIG. 6. FIG. 7 shows a temperature distribution within the graphite crucible 201, obtained as a result of the analysis. As understood from isotherms being bent largely in the figure, in the growth surface of the silicon carbide single crystal 7, there arose a difference in temperature of about 2° C. between the center and the edge portion. Therefore, it is considered that the shape of the growth surface of the silicon carbide single crystal 7 is determined in accordance with the temperature distribution.

In consideration of the results mentioned above, a graphite crucible 301 shown in FIG. 8 is adopted in the fourth embodiment. Specifically, the graphite crucible 301 is composed of a crucible body 310 with an upper face opened, and a lid member 311. The crucible body 310 has a step portion 310a at the side of the opening portion. The crucible body 310 has a cup shape with a circular cross-section, and silicon carbide material 2 is disposed on the bottom of the cup shape.

The lid member 311 has a circular (disk like) shape that corresponds to the shape of the opening portion of the crucible body 310. The lid member 311 is composed of a seed crystal attachment member 312 and a poly crystal growth member 313. The seed crystal attachment member 312 is formed with a cylindrical protruding portion 312a protruding from the central portion of the disk like shape thereof, and the seed crystal 5 is bonded to a front end surface (support surface) 312b of the protruding portion 312a. The protruding portion 312a constitutes a seed crystal attachment portion, and the seed crystal attachment member 312 other than the protruding portion 312a (peripheral portion of the protruding portion 312a) and the poly crystal growth member 313 constitute a peripheral portion of the seed crystal attachment portion.

The poly crystal growth member 313 is inserted from the opening portion of the crucible body 310, and is held at a specific position by the step portion 310a of the crucible body 310. The poly crystal growth member 313 has a hollow portion 313a having a circular cross section at the center thereof, and the protruding portion 312a of the seed crystal attachment member 312 is inserted into the hollow portion 313a. The inner diameter of the hollow potion 313a is slightly larger than the outer diameter of the protruding portion 312a such that a gap having a specific width is provided between the inner circumference wall of the hollow portion 313a and the outer circumference wall of the protruding portion 312a.

Specifically, the gap d is preferably in a range of 0.5 mm to 3 mm, and is controlled to be about 1 mm in this embodiment. This is because if the gap d is too small, it is considered as if it is substantially zero, and if the gap d is too large, the gap d works as if it is a part of a growth space. Further, the poly crystal growth member 313 has a cylindrical guide 313b that is separated from the hollow portion 313a at an equal distance to surround the hollow portion 313a. The poly crystal growth member 313 has a surface 313c that is parallel to or coplanar with the growth surface on the protruding portion 312a of the seed crystal attachment member 312, and the guide 313b protrudes from the surface 313c toward the silicon carbide material 2.

Figure 9:
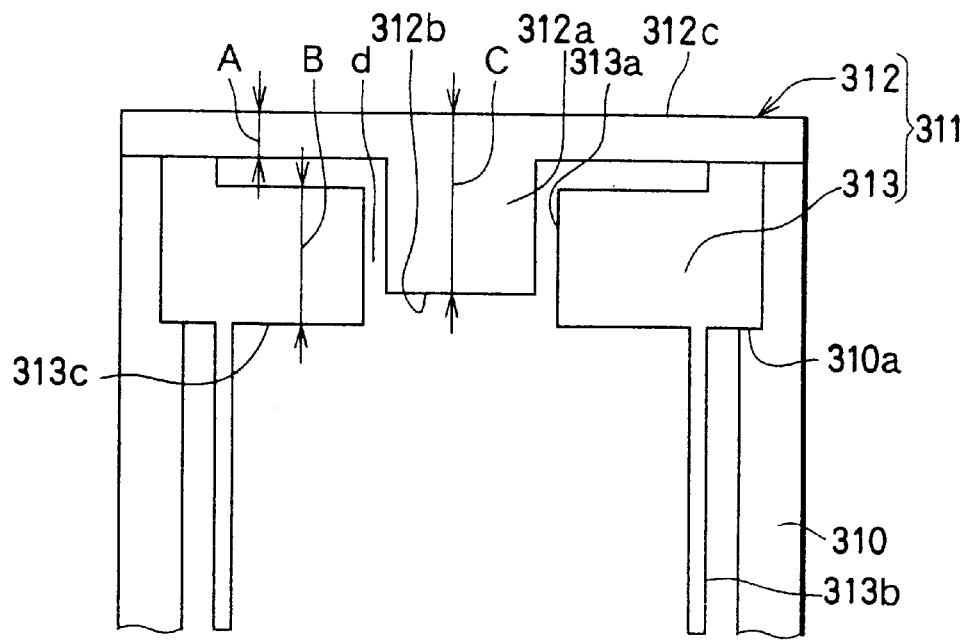
FIG. 9 is a schematic view for explaining thicknesses of parts of a lid member of the graphite crucible shown in FIG. 8.

Referring to FIG. 9, assuming that the thickness of the portion 312c surrounding the protruding portion 312 of the seed crystal attachment member 312 is A, the portion surrounding the protruding portion 312 (the portion at an inner side than the guide 313c) of the poly crystal growth member 313 is B, and the thickness of the protruding portion 312a is C, the sum of the thickness A and the thickness B is larger than the thickness C (A+B>C). Further, when the seed crystal 5 is bonded, the growth surface of the seed crystal 5 becomes approximately coplanar with or slightly projects-;from the surface 313c of the poly crystal growth member 313. Incidentally, the thickness B of the poly crystal growth member 313 is preferably approximately larger than 5 mm. Otherwise, the poly crystal growth member 313 may be made of a material to have a heat transfer rate superior to those of other parts.

According to the construction as mentioned above, when the seed crystal attachment member 312 and the poly crystal growth member 313 are observed from the side of the silicon carbide material 2, the protruding portion 312a not holding the seed crystal 5 thereon is recessed from the surface of the poly crystal growth member 313, and the protruding portion 312a holding the seed crystal 5 thereon is coplanar with or slightly protrudes from the surface of the poly crystal growth member 313.

Further, referring back to FIG. 8, the graphite crucible 301 can be heated by a heater 9 within a vacuum vessel (heating furnace) into which argon gas can be introduced. The seed crystal 5 is kept with a temperature lower than that of the silicon carbide material 2 by about 100° C. by controlling the power of the heater 9.

Figure 10:
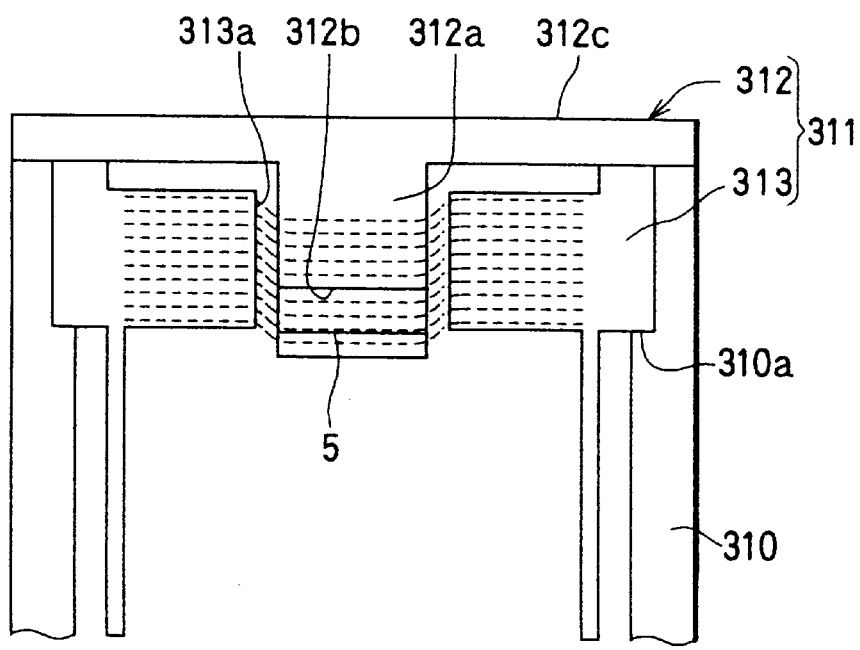
FIG. 10 is a schematic view showing temperature distribution on a growth surface of a seed crystal in the graphite crucible shown in FIG. 8, which is obtained by a simulation.

The temperature distribution when the graphite crucible 301 constructed as above was heated by the heater 9 was obtained by a heat simulation. The result is shown in FIG. 10. In the figure, broken lines are isotherms, and the temperature is increased gradually from the upper side toward the lower side in the paper space. The surface temperature of the seed crystal 5 is slightly lower than that of the poly crystal growth member 313. Further, the growth surface temperature of the seed crystal 5 for the silicon carbide single crystal 7 is approximately uniform. More specifically, the temperature distribution $\Delta T$ on the growth surface was about 0.3° C.

In this construction, because the protruding portion 312a to which the seed crystal 5 is bonded is separated from the poly crystal growth member 313 and the thickness C of the protruding portion 312a is smaller than the sum of the thickness A, B of the portions surrounding the protruding portion 312a, heat is difficult to be transmitted from the poly crystal growth member 313 to the protruding portion 312a. Further, the protruding portion 312a is constructed such that it easily radiates heat. Therefore, the result shown in FIG. 10 can be obtained.

Figure 8:
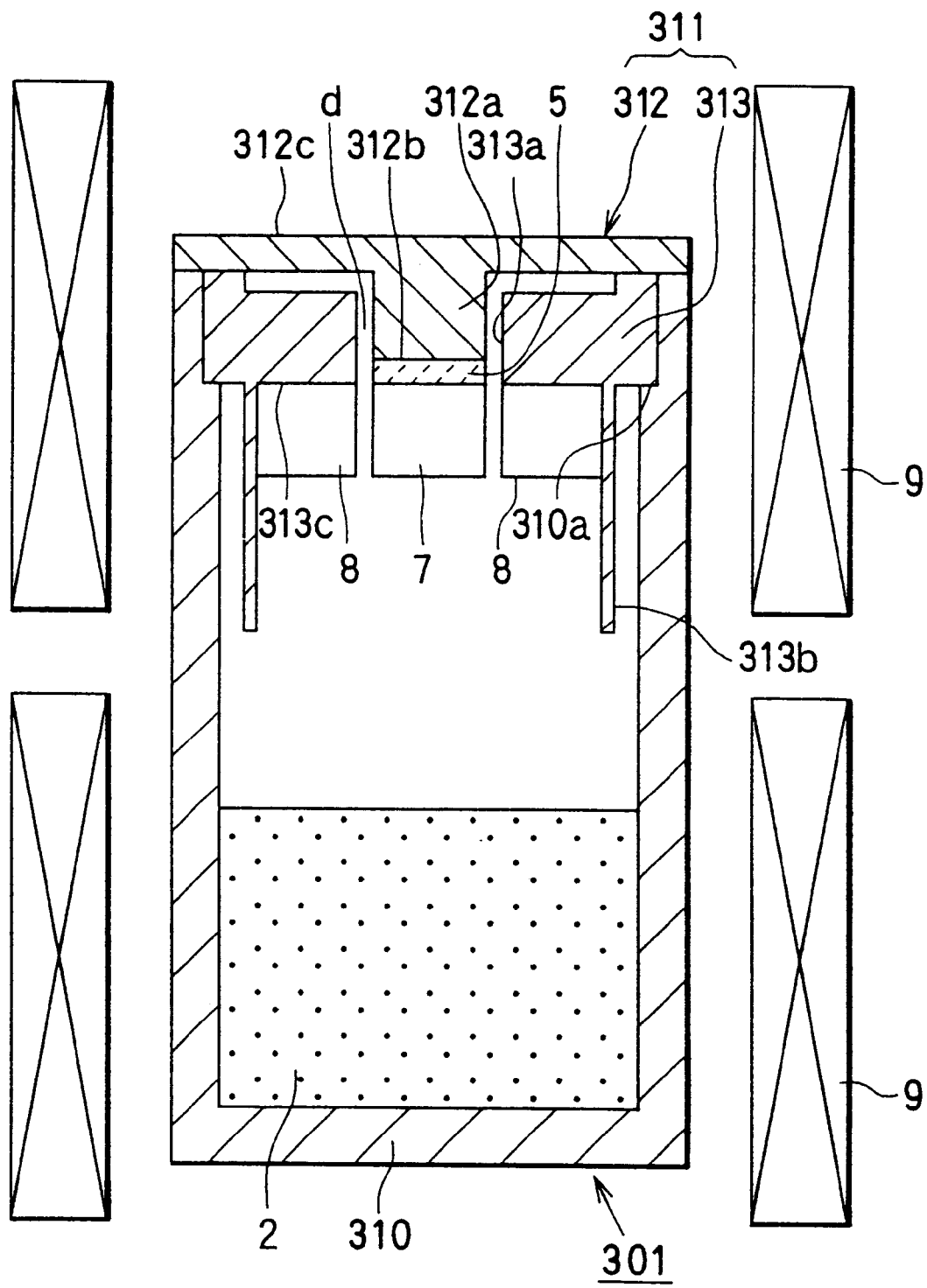
FIG. 8 is a cross-sectional view showing a graphite crucible according to the fourth embodiment.

Within this graphite crucible 301, the silicon carbide single crystal 7 was grown on the seed crystal 5 having a (0001) plane as the growth surface. Specifically, the growth pressure was set at 100 Torr, and the crystal growth was carried out for 15 hours while controlling a transport rate of source material. As shown in FIG. 8, this crystal growth was accompanied with poly crystal 8 grown on the surface 313c of the poly crystal growth member 313; however, it was confirmed that the poly crystal 8 grew with a specific interval from the silicon carbide single crystal 7 to surround the silicon carbide single crystal 7. That is, the silicon carbide single crystal 7 grows in state where it is embedded in the poly crystal 8 (embedding growth).

The growth surface of the silicon carbide single crystal 7 was approximately coplanar with or slightly protruded from the growth surface of the poly crystal 8. That is, the height of the silicon carbide single crystal 7 was approximately equal to that of the polycrystal 8. The relation in position between the growth surface of the silicon carbide single crystal 7 and the growth surface of the poly crystal 8 was approximately stable during the growth. This means that the relation in temperature between those growth surfaces is similar to (inherits from) that between the growth surface of the seed crystal 5 and the surface of the poly crystal growth member 313 even when the silicon carbide single crystal 7 and the poly crystal 8 grow. That is, the growth surface temperature of the silicon carbide single crystal 7 is slightly lower than that of the poly crystal 8, and the temperature distribution on the growth surface of the silicon carbide single crystal 7 is uniform.

Further, the silicon carbide single crystal 7 was formed with facet faces having a wave pattern extending from generally the center of the growth surface. The facet faces was about 60% or more in area of the growth surface of the silicon carbide single crystal 7, and no crack defect was produced on the facet faces.

Thus, when the silicon carbide single crystal 7 and the poly crystal 8 are grown on the adjacent different growth surfaces that are approximately coplanar with each other (the growth surface of the seed crystal 5 and the surface 313c of the poly crystal growth member 313 in this embodiment), the silicon carbide single crystal 7 and the poly crystal 8 can be grown separately while providing a specific gap therebetween. Further, because the temperature distributions on the growth surfaces of the seed crystal 5 and the silicon carbide single crystal 7 can be made approximately uniform, the growth surface of the silicon carbide single crystal 7 becomes flat and crack defects can be prevented from being produced in the silicon carbide single crystal 7.

Furthermore, because the growth surface of the silicon carbide single crystal 7 can be made flat, a number of wafers, which is formed from the silicon carbide single crystal 7, is increased. In a doping technique, impurities can be doped uniformly.

(Fifth Embodiment)

Figure 11:
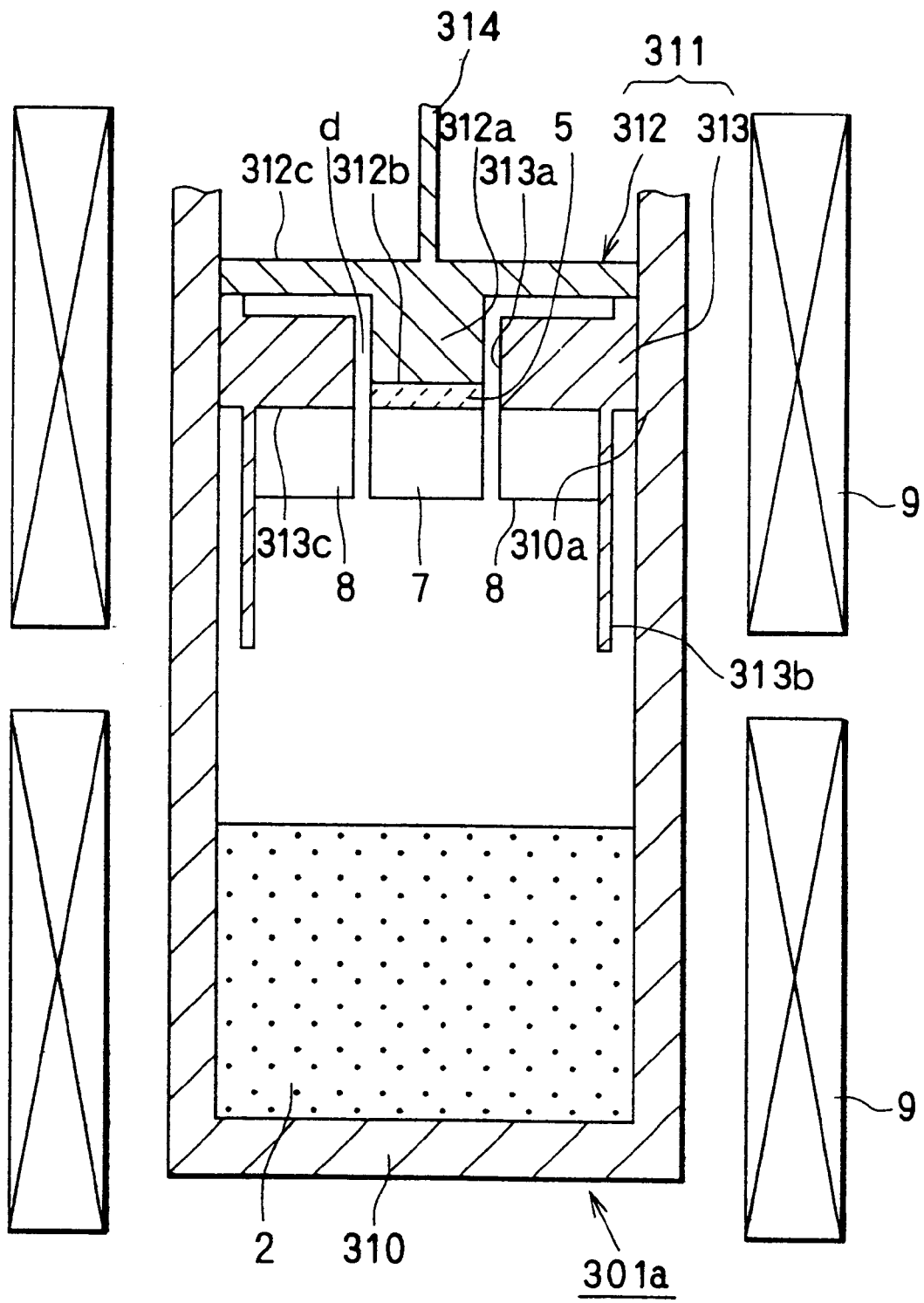
FIG. 11 is a cross-sectional view showing a graphite crucible according to a fifth preferred embodiment.

FIG. 11 shows a graphite crucible 301a in a fifth preferred embodiment, in which the same parts as those in the fourth embodiment are designated by the same reference numerals as in the fourth embodiment. Only different points will be explained.

As shown in FIG. 11, the crucible body 310 of the graphite crucible 301a extends in an upper direction (in a direction for allowing a distance from the silicon carbide material 2 to be large) to a position upper than the position where the seed crystal attachment member 312 and the poly crystal growth member 313 are disposed. The seed crystal attachment member 312 and the poly crystal growth member 313 are mutually connected at a contacting portion, and are constructed such that they can be pulled up in the upper direction by a support member 314 provided on the seed crystal attachment member 312.

The silicon carbide single crystal 7 was grown on the growth surface of the seed crystal 5 within the graphite crucible 301a constructed as mentioned above in a manner similar to the fourth embodiment, and simultaneously the poly crystal 8 was grown on the surface 313c of the poly crystal growth member 313. At that time, in this embodiment the seed crystal attachment member 312 and the poly crystal growth member 313 are pulled up such that the growth rate of the silicon carbide single crystal 7 becomes constant, and such that the distance of the growth surfaces of the silicon carbide single crystal 7 and the poly crystal 8 from the silicon carbide material 2 becomes constant. Specifically, the pulling-up (moving) speed of the seed crystal attachment member 312 and the poly crystal growth member 313 was controlled to be about 0.2 mm/h, which was approximately equal to the growth rate of the silicon carbide single crystal 7.

Thus, because the distance of the growth surfaces of the silicon carbide single crystal 7 and the poly crystal 8 from the silicon carbide material 2 can be kept constant, the temperature of the growth surface of the silicon carbide single crystal 7 and the temperature of the growth surface of the poly crystal 8 hardly vary with time. Consequently, the crystallinity of the silicon carbide single crystal 7 is further improved.

(Sixth Embodiment)

Figure 12:
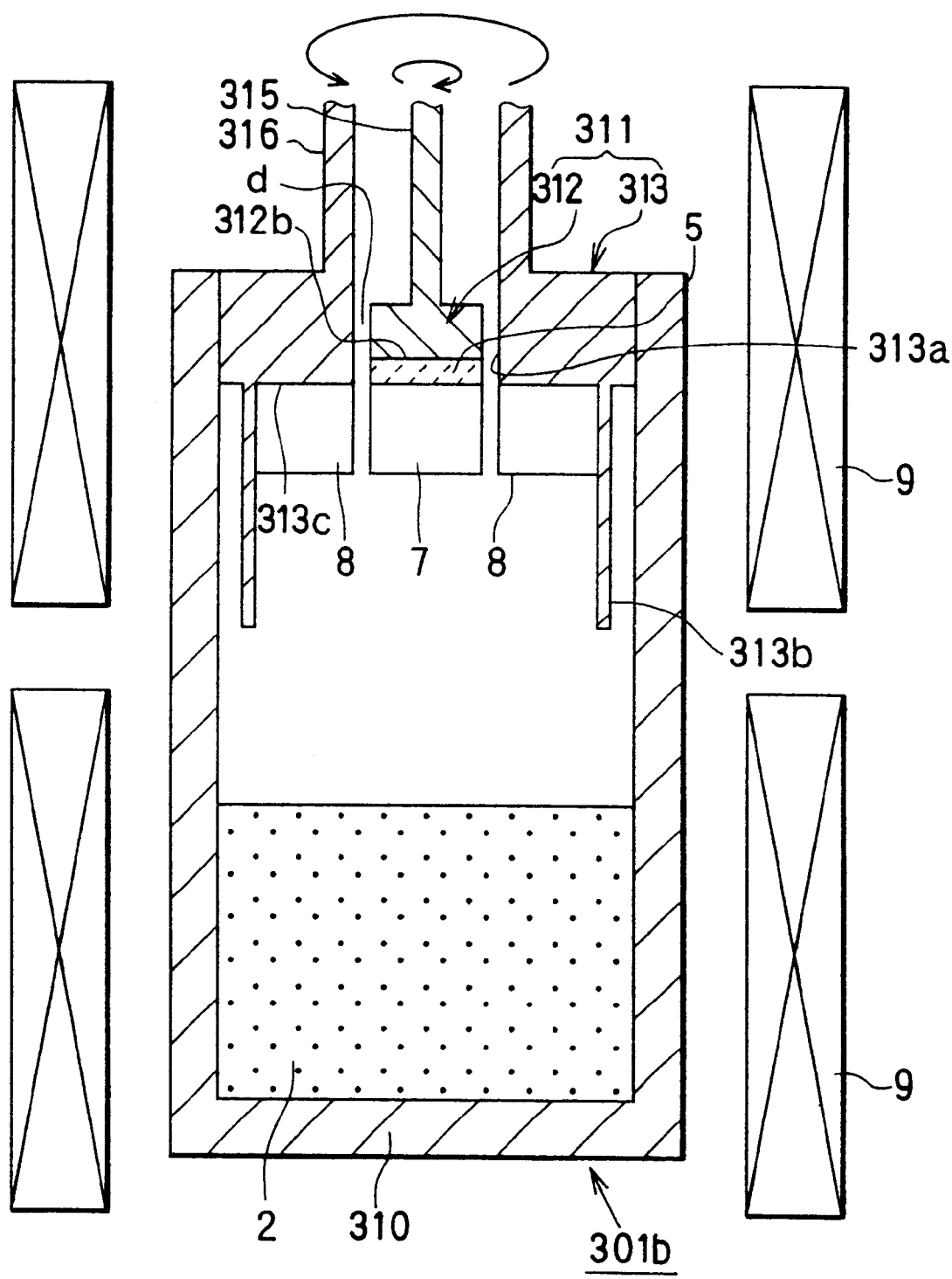
FIG. 12 is a cross-sectional view showing a graphite crucible according to a sixth preferred embodiment.

FIG. 12 shows a graphite crucible 301b in a sixth preferred embodiment, in which the same parts as those in the fourth embodiment are designated by the same reference numerals as in the fourth embodiment. Only different points will be explained below.

As shown in FIG. 12, the seed crystal attachment member 312 is positioned in a hollow portion 313a provided in the poly crystal growth member 313. Further, the seed crystal attachment member 312 and the poly crystal growth member 313 are respectively supported by support members 315, 316 such that they can rotate in mutually reverse directions about the support members 15, 16 that work as center axes respectively. Here, the support member 316 is cylindrical and coaxial with the support member 315.

Within the graphite crucible 301b constructed as mentioned above, the silicon carbide single crystal 7 was grown on the growth surface of the seed crystal 5 in a manner similar to the fourth embodiment, and simultaneously the poly crystal 8 was grown on the growth surface of the poly crystal growth member 313. At that time, the seed crystal attachment member 312 and the poly crystal growth member 313 were rotated in the mutually reverse directions.

Because the seed crystal attachment member 312 and the poly crystal growth member 313 are rotated in the mutually reverse directions during the growths of the silicon carbide single crystal 7 and the poly crystal 8, the silicon carbide single crystal 7 and the poly crystal 8 can be isolated from each other securely and be prevented from contacting each other even when those growths progress.

Specifically, because the growth amounts of the silicon carbide single crystal and the poly crystal 8 are approximately equal to each other, the growth surface of the two are kept to be approximately coplanar with each other. However, both the single crystal 7 and the poly crystal 8 grow not only in the longitudinal (axial) direction but also in a lateral (radial) direction to eliminate the difference in temperature between them when the single crystal 7 has a long dimension, so that there arises a possibility that the two crystals 7, 8 are integrated together. In comparison, in the sixth embodiment, the silicon carbide single crystal 7 and the poly crystal 8 are prevented from being integrated together by the seed crystal attachment member 312 and the poly crystal growth member 313 which are rotated in the mutually reverse directions. This also makes it possible to improve the crystallinity of the silicon carbide single crystal 7 having a long dimension.

(Seventh Embodiment)

Figure 13:
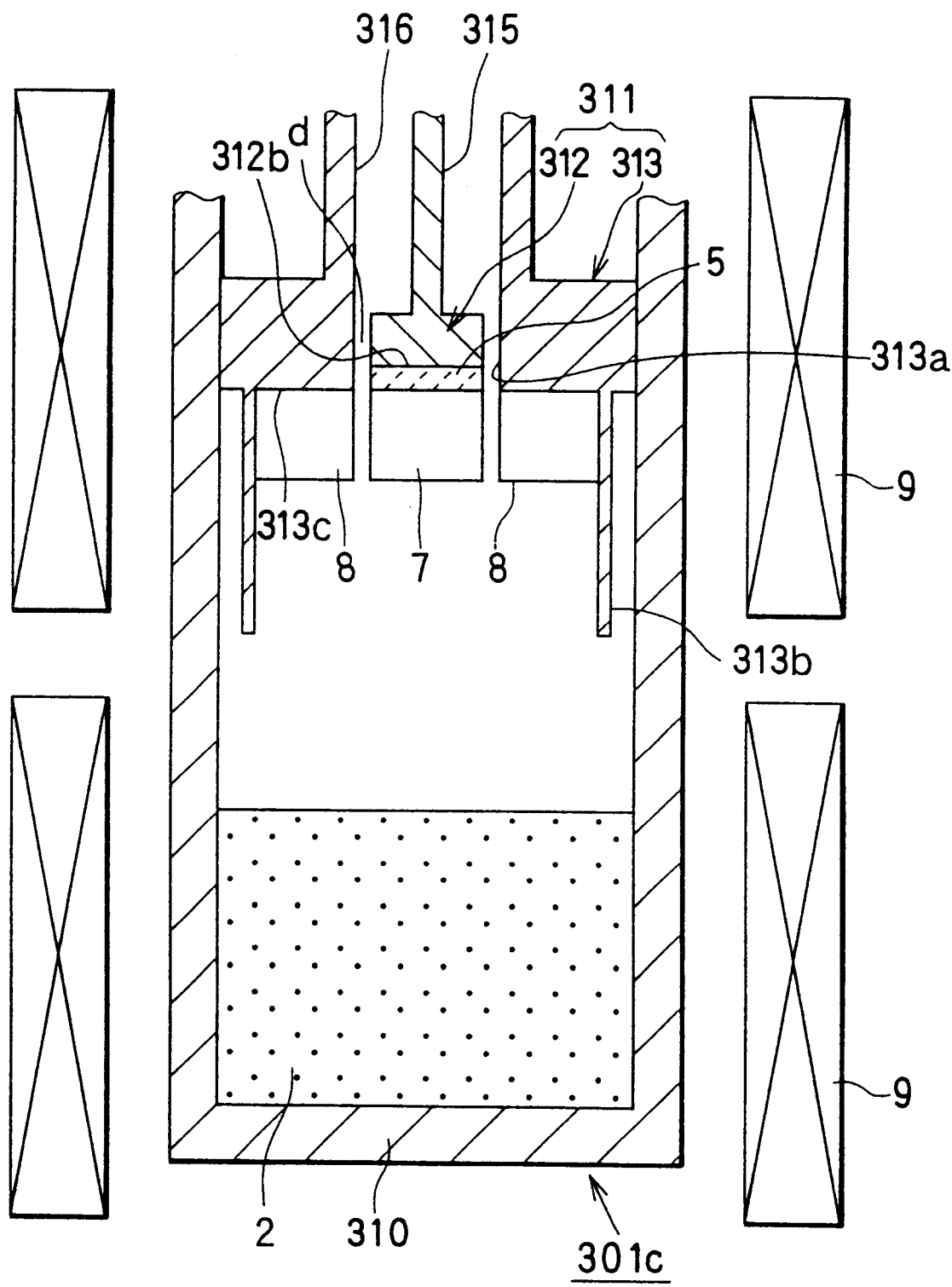
FIG. 13 is a cross-sectional view showing a graphite crucible according to a seventh preferred embodiment.

FIG. 13 shows a graphite crucible 301c in a seventh preferred embodiment, in which the same parts as those in the fourth embodiment are designated by the same reference numerals in the fourth embodiment. Only different points will be explained below.

As shown in FIG. 13, the graphite crucible 301c in this embodiment is different from the graphite crucible 301b shown in FIG. 12 in the sixth embodiment in point that the crucible body 310 is extended upward as compared to that in FIG. 12. Accordingly, the seed crystal attachment member 312 and the poly crystal growth member 313 can be pulled up in the upper direction. That is, in this embodiment, the seed crystal attachment member 312 and the poly crystal growth member 313 can be pulled up as in the fifth embodiment, and simultaneously be rotated in mutually reverse directions as in the sixth embodiment.

Within the graphite crucible 301c constructed as mentioned above, the silicon carbide single crystal 7 was grown on the growth surface of the seed crystal 5 and the poly crystal 8 was grown on the surface 313c of the poly crystal growth member 313. At that time, the seed crystal attachment member 312 and the poly crystal growth member 313 were rotated in the mutually reverse directions, and simultaneously were pulled up with a rate similar to that of growths of the silicon carbide single crystal 7 and the poly crystal 8.

Accordingly, the isolation of the silicon carbide single crystal 7 from the poly crystal 8 can be made certain by rotating the seed crystal attachment member 312 and the poly crystal growth member 313 in the mutually reverse directions. Further, the changes in temperature of the growth surfaces of the silicon carbide single crystal 7 and the poly crystal 8 with time can be suppressed efficiently by pulling up the seed crystal attachment member 312 and the poly crystal growth member 313 in the upper direction. As a result, the silicon carbide single crystal 7 can be lengthened with improved crystallinity.

In the fourth to seventh embodiments, the temperature of the growth surfaces of the seed crystal 5 and the silicon carbide single crystal 7 is controlled to be lower than that of the growth surface of the poly crystal 8 due to the relation between the thickness C of the protruding portion 312c of the seed crystal attachment member 312 and the thicknesses A, B of its peripheral portions; however, this temperature relation may be set by other constitutions.

Also, in the sixth and seventh embodiments, although the seed crystal attachment member 312 and the poly crystal growth member 313 are rotated in the mutually reverse directions, it is not always necessary that both the members 312, 313 rotate as long as the members 312, 313 rotates relatively. For example, only the seed crystal attachment member 312 can rotate. In addition, the crucible body 310 can be rotated in addition to the seed crystal attachment member 312 and the poly crystal growth member 313. In this case, the crucible body 310 should be rotated relatively in the direction opposite to that of the poly crystal growth member 313.

In the fifth and seventh embodiments, both the seed crystal attachment member 312 and the poly crystal growth member 313 are pulled up in the upper direction; however, only the seed crystal attachment member 312 may be pulled up. In this case, the growth surface of the poly crystal 8 may be located at the lower position than that of the silicon carbide single crystal 7. Therefore, the temperature of the silicon carbide single crystal 7 is further lowered as compared to that of the poly crystal 8, so that only the silicon carbide single crystal 7 grows while keeping the growth surface flat. Further, because the growth of the silicon carbide single crystal 7 progresses in state where the growth surface is surrounded by the poly crystal 8 having a stable Si/C ratio, the silicon carbide single crystal 7 can have excellent crystallinity. Furthermore, the deviation between the growth surfaces of the silicon carbide single crystal 7 and the poly crystal 8 can be compensated automatically due to sublimation and recrystallization of the poly crystal 8.

While the present invention has been shown and mentioned with reference to the foregoing preferred embodiments, it will be apparent to those skilled in the art that changes in form and detail may be made therein without departing from the scope of the invention as defined in the appended claims.

What is claimed is:

1. A method for fabricating a single crystal, comprising:
    preparing a vessel defining therein a growth space and having a seed crystal attachment portion, and a peripheral portion surrounding the seed crystal attachment portion, the seed crystal attachment portion having a support surface exposed to the growth space and recessed from a peripheral surface of the peripheral portion;
    attaching a seed crystal to the support surface of the seed crystal attachment portion such that the seed crystal covers an entire area of the support surface and is surrounded by the peripheral surface of the peripheral portion; and
    growing a single crystal on a growth surface of the seed crystal and a poly crystal on the peripheral surface of the peripheral portion by introducing a material gas within the growth space of the vessel, the single crystal being grown to have a height approximately equal to a height of the poly crystal.

2. The method according to claim 1, wherein:
    the seed crystal is attached to the support surface to have the growth surface that is approximately coplanar with the peripheral surface of the peripheral portion and to define a gap with the peripheral portion; and
    the single crystal and the poly crystal are respectively grown on the growth surface of the seed crystal and the peripheral surface of the peripheral portion to be separated from each other due to the gap.

3. A method for fabricating a silicon carbide single crystal, comprising;
    preparing a crucible defining therein a growth space, and having a seed crystal attachment portion and a peripheral portion surrounding the seed crystal attachment portion;
    attaching a seed crystal to a support surface of the seed crystal attachment portion;
    introducing a silicon carbide material gas into the growth space of the crucible; and
    growing a silicon carbide single crystal on a growth surface of the seed crystal, and a silicon carbide poly crystal on a surface of the peripheral portion such that a height of the silicon carbide poly crystal is approximately equal to a height of the silicon carbide single crystal.

4. The method according to claim 3, wherein the silicon carbide single crystal is grown to be embedded in the silicon carbide poly crystal.

5. The method according to claim 3, wherein the silicon carbide single crystal is grown with a growth surface that is approximately coplanar with a growth surface of the silicon carbide poly crystal.

6. The method according to claim 3, wherein the silicon carbide single crystal and the silicon carbide poly crystal are respectively grown on the growth surface of the seed crystal and the surface of the peripheral portion by controlling a temperature of the growth surface of the seed crystal to be lower than a temperature of the surface of the peripheral portion.

7. The method according to claim 3, wherein the peripheral portion has a thickness larger than a thickness of the seed crystal attachment portion.

8. The method according to claim 3, wherein a gap is provided between the seed crystal attachment portion and the peripheral portion.

9. The method according to claim 8, wherein the gap has a width that is in a range of 0.5 mm to 3 mm.

10. The method according to claim 3, wherein, when the silicon carbide single crystal and the silicon carbide poly crystal are grown on the seed crystal and the peripheral portion, the seed crystal attachment portion and the peripheral portion are rotated in relatively inverse directions to each other.

11. The method according to claim 3, wherein, when the silicon carbide single crystal and the silicon carbide poly crystal are grown on the seed crystal and the peripheral portion within the crucible in which a source material is disposed to face the seed crystal and the peripheral portion, the seed crystal attachment portion is moved such that a distance of the seed crystal from the source material is increased.

12. The method according to claim 11, wherein a moving speed of the seed crystal attachment portion is approximately equal to a growth rate of the silicon carbide single crystal.

13. The method according to claim 3, wherein the peripheral portion has a thickness larger than approximately 5 mm.

14. A method for fabricating a silicon carbide single crystal, comprising:
    preparing a crucible defining therein a growth space, and having a seed crystal attachment portion and a peripheral portion surrounding the seed crystal attachment portion;
    attaching a seed crystal to a support surface of the seed crystal attachment portion;
    introducing a silicon carbide material gas into the growth space of the crucible; and
    growing a silicon carbide single crystal on a growth surface of the seed crystal, and a silicon carbide poly crystal on the surface of the peripheral portion with a growth surface that is approximately coplanar with a growth surface of the silicon carbide single crystal.

15. The method according to claim 14, wherein the peripheral portion has a thickness larger than a thickness of the seed crystal attachment portion.

16. The method according to claim 14 wherein a gap is provided between the seed crystal attachment portion and the peripheral portion.

17. The method according to claim 14, wherein, when the silicon carbide single crystal and the silicon carbide poly crystal are grown on the seed crystal and the peripheral portion, the seed crystal attachment portion and the peripheral portion are rotated in relatively inverse directions to each other.

18. An apparatus for fabricating a single crystal, comprising a crucible defining a growth space therein and having an inner surface exposed to the growth space, wherein:
    the inner surface has a recess for holding a seed crystal on which a single crystal is to be grown using a material gas, the recess having a bottom face that is entirely covered by the seed crystal when the seed crystal is attached to the support portion.

19. The apparatus according to claim 18, wherein the bottom face of the recess is surrounded by a groove having a specific width for isolating the single crystal from a poly crystal that is grown on a peripheral inner surface surrounding the recess when the single crystal and the poly crystal are grown on the seed crystal and the peripheral inner surface.

20. An apparatus for fabricating a single crystal, comprising:
   a crucible defining a growth space therein and having an inner surface exposed to the growth space:
   a seed crystal attachment portion having a support surface for holding a seed crystal thereon, the support surface being exposed to the growth space as a first part of the inner surface; and
   a peripheral portion surrounding the seed crystal attachment portion and having a peripheral surface exposed to the growth space as a second part of the inner surface, wherein:
   the support surface is recessed from the peripheral surface;
   a gap is provided between the seed crystal attachment portion and the peripheral portion; and
   the seed crystal attachment portion and the peripheral portion are constructed such that a single crystal can be grown on a growth surface of the seed crystal to be embedded in a poly crystal grown on the peripheral surface, and to have a height approximately equal to a height of the poly crystal.

21. An apparatus for fabricating a single crystal, comprising:
   a crucible defining a growth space therein and having an inner surface exposed to the growth space:
   a seed crystal attachment portion having a support surface for holding a seed crystal thereon, the support surface being exposed to the growth space as a first part of the inner surface; and
   a peripheral portion surrounding the seed crystal attachment portion and having a peripheral surface exposed to the growth space as a second part of the inner surface, wherein:
   a single crystal is grown on a growth surface of the seed crystal, which is attached to the support surface of the seed crystal attachment portion, by a material gas introduced into the growth space; and
   a poly crystal is grown on the peripheral surface to surround the single crystal and to have a height approximately equal to a height of the single crystal.

22. The apparatus according to claim 21, wherein the seed crystal attachment portion and the peripheral portion are constructed such that a temperature of the growth surface of the seed crystal attached to the seed crystal attachment portion is controlled to be lower than a temperature of the peripheral surface.

23. The apparatus according to claim 21, wherein a gap is provided between the seed crystal attachment portion and the peripheral portion.

24. The apparatus according to claim 23, wherein the gap has a width in a range of 0.5 mm to 3 mm.

25. The apparatus according to claim 21, wherein the seed crystal attachment portion and the peripheral portion are rotatable in relatively reverse directions.

26. The apparatus according to claim 21, wherein the seed crystal attachment portion is movable in a direction such that a distance of the support surface from a source material, which is disposed in the vessel, is increased.

27. An apparatus for fabricating a single crystal, comprising;
   a crucible defining therein a growth space by an inner surface thereof;
   a seed crystal attachment portion exposed to the growth space as a first part of the inner surface of the crucible for holding a seed crystal; and
   a peripheral portion surrounding the seed crystal attachment portion and exposed to the growth space as a second part of the inner surface,
   wherein a thickness of the seed crystal attachment portion in a direction in which a single crystal is grown on the seed crystal is smaller than a thickness of the peripheral portion.

* * * * *